United States Patent [19]

Saitou et al.

[11] Patent Number: 4,727,221
[45] Date of Patent: Feb. 23, 1988

[54] SEMICONDUCTOR MEMORY DEVICE

[75] Inventors: Akitoshi Saitou; Mikio Bessho, both of Tokyo, Japan

[73] Assignee: NEC Corporation, Japan

[21] Appl. No.: 931,652

[22] Filed: Nov. 17, 1986

[30] Foreign Application Priority Data

Nov. 15, 1985 [JP] Japan .................................. 60-254673

[51] Int. Cl.[4] ........................................... H01L 23/06
[52] U.S. Cl. ...................... 174/52 FP; 357/84;
361/220; 428/344; 428/473.5
[58] Field of Search ............... 174/52 FP; 357/74, 84;
361/220; 428/214, 344, 473.5

[56] References Cited

U.S. PATENT DOCUMENTS 4,008,945 2/1977 Scherer ...................... 174/52 FP X
4,326,214 4/1982 Trueblood ............................ 357/74

FOREIGN PATENT DOCUMENTS

| | | |
|---|---|---|
| 0069985 | 1/1983 | European Pat. Off. .............. 357/84 |
| 55-130149 | 10/1980 | Japan .................................... 357/84 |
| 55-140250 | 11/1980 | Japan .................................... 357/84 |
| 59-27548 | 2/1984 | Japan .................................... 357/74 |
| 60-120541 | 6/1985 | Japan .................................... 357/74 |
| 60-38840 | 9/1985 | Japan .................................... 357/74 |

Primary Examiner—Arthur T. Grimley
Assistant Examiner—David A. Tone
Attorney, Agent, or Firm—Laff, Whitesel, Conte & Saret

[57] ABSTRACT

An UV-EPROM has a window for transmitting ultraviolet rays during the erasing operation, which is covered by a shading sheet including a metallic film, a polyimide film laminated on the upper surface of the metallic film, and a bond film attached to the lower surface of the metallic film.

4 Claims, 4 Drawing Figures

SEMICONDUCTOR MEMORY DEVICE

BACKGROUND OF THE INVENTION

The present invention relates to a semiconductor memory device, and more particularly to a semiconductor memory device of a type in which electrically written information is erased by ultra-violet rays. The device is called as a UV-EPROM and its package has a window plate made of a material (e.g., quartz glass) transparent with respect to ultra-violet rays through which the irradiating rays are to be applied to a UV-EPROM chip housed within the package to conduct the erasing operation. When the device is not under the erasing operation, the window plate is covered by a shading sheet in order to prevent erasure of the stored information or maloperation of the device due to lights including ultra-violet rays. In the prior art, the shading sheet is made of an ordinary paper and a band film formed on the back surface of the paper and the sheet adheres to the surface of the window plate. The band film does not permanently fix the paper to the window so that the paper can be peeled from the window during the erasing operation. The ordinary paper has a high electrical resistivity of $10^6$ Ω·cm or more and is generally opaque against lights, particularly to lights of 4000 Å wave length or less including ultra-violet rays. In the semiconductor memory device of the prior art, the shading sheet as well as the window material has the high electrical resistivity and therefore, a large amount of electric charges are easily accumulated on the window plate when the upper portion of the package, that is, the window covered by the shading sheet contacts and collides with another insulating material such as another package or a magazine case in which many UV-EPROM's are installed. The accumulated charges induce a high electric field which is applied to the UV-EPROM chip positioned under the window to cause maloperation of the device. Possible measures to avoid such maloperation would be a very thick passivation film coated on the surface of the chip or a thin gold film of 1000 Å thickness or less coated on the window plate to discharge the accumulated charges. However, in the former case, unfavorable cracks are easily produced in the thick passivation film, and in the latter case, sufficient discharge cannot be expected and a cost of the package becomes high because of the use of gold.

SUMMARY OF THE INVENTION

Accordingly, an object of the present invention is to provide a semiconductor memory device with a window in which the stored information is not destroyed and the maloperation is prevented even if its package is contacted or collided with another insulating body.

Another object of the present invention is to provide an improved shading sheet which adheres to a window of a UV-EPROM.

According to a feature of the present invention, there is provided a semiconductor memory device comprising a UV-EPROM chip, a package made of insulating material such as ceramic in which the chip is housed, a window plate made of a material transparent to ultra-violet rays and fixed to a portion of the housing at a location above the chip, and a shading sheet adhering to the outer surface of the window plate and including a bond film, a metallic film made of, for example, aluminum formed on the bond film and a polyimide film formed on the metallic film. The bond film is made of a bond material, for example, silicone bond, which does not rigidly adhere to the window plate but allows the shading sheet to be easily peeled off from the window plate to expose the surface of the window during the erasing operation. Practically, the thicknesses of the bond film, the metallic film and the polyimide film range favorably 10 μm to 100 μm, 0.5 μm to 5 μm and 30 μm to 100 μm, respectively. The metallic film such as aluminum film is provided for preventing accumulation of the large amount of electric charges on the window plate and for shading lights, specially lights having 400 Å wavelength or less including ultra-violet rays. The polyimide film is used as an insulating film of the shading sheet and used as a base film on which the metallic film is deposited by evaporation, for example. The polyimide film can withstand a temperature of 300° C. and therefore, aluminum can be deposited on the polyimide film within an evaporation chamber to from the aluminum film.

EMBODIMENT OF THE PRESENT INVENTION

Figure 1:
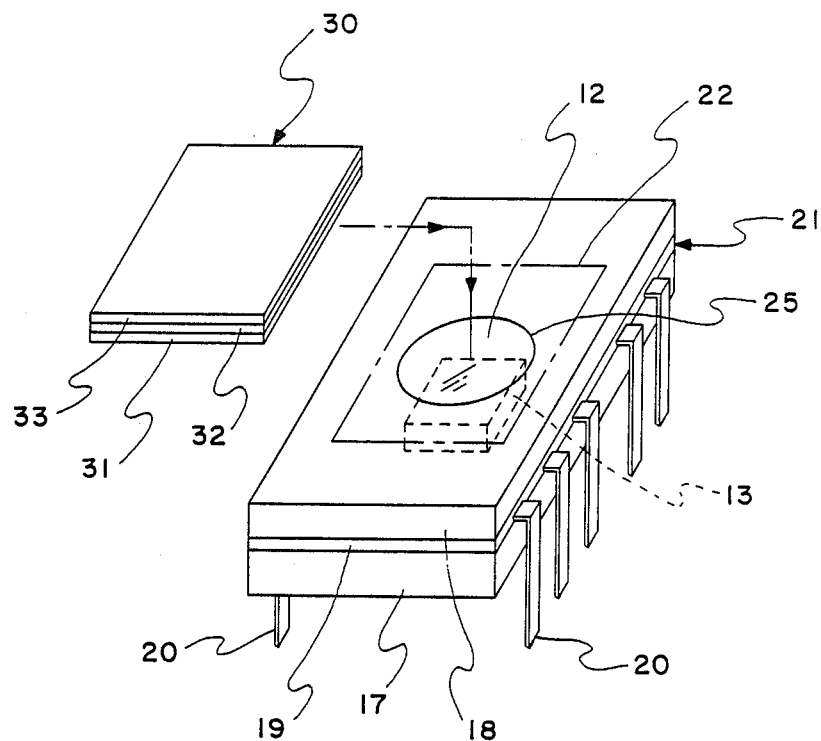
FIG. 1 is a perspective view showing an embodiment of the present invention.
Figure 2:
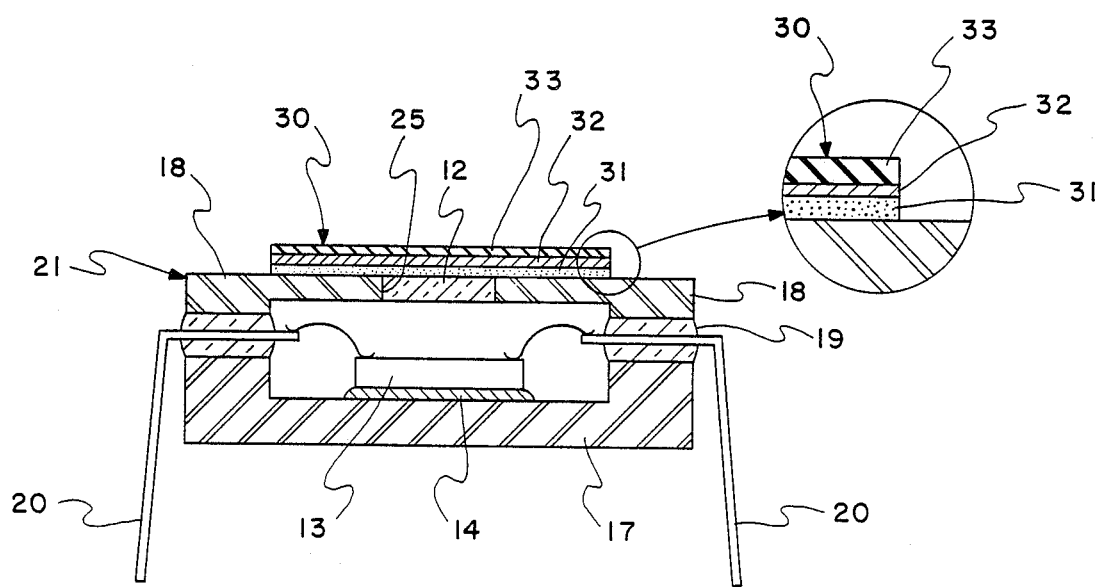
FIG. 2 is a cross-sectional view of FIG. 1 when the shading sheet is attached to the window.

Referring to FIGS. 1 and 2, a package 21 houses a UV-EPROM chip 13 which is attached to an alumina-ceramic base plate 17 by a solder 14. An alumina-ceramic lid 18 is bonded to the base 17 of the package 21 by glass 19 having a low-melting point. A plurality of leads 20 are inserted into the inner space of the package 21 via the glass layer 19 and they are outwardly extended from the opposite sides of the package 21. A round aperture 25 of 9 mm in diameter is opened at a center of the lid 18 above the chip 13 and a window plate 12 made of quartz glass transparent to ultra-violet rays is hermetically fixed to the aperture 25. Ultra-vilet rays may irradiate the chip 13 through the window plate 12 in erasing operation. A shading sheet 30 is attached to an area 22 of the upper surface of the lid 18 to cover the window 12. The shading sheet 30 includes a bond film 31 made of a silicone bond material and having a thickness of 25 μm, an aluminum film 32 laminated on the bond film and having a thickness of 'b μm, and a polyimide film 33 laminated on the aluminum film 32 and having a thickness of 60 μm.

Figure 3:
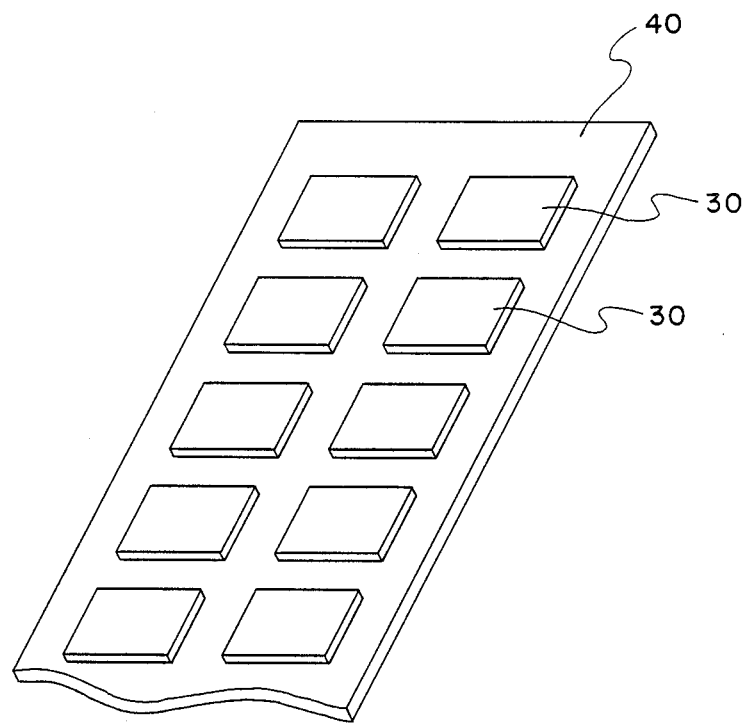
FIG. 3 is a perspective view showing the shading sheets of the present invention provided on a mounting pasteboard.

The shading sheet 30 is produced through separate processes from the manufacture of the UV-EPROM's. Referring to FIG. 3, a plurality of cut pieces of the shading sheets 30, each in size of 12 mm × 16 mm, are bonded on a pasteboard 40 made of vinyl chloride. Each of the shading sheets 30 is peeled off from the pasteboard 40 and bonded to the lid 18 of the UV-EPROM to cover the window 12. The shading sheets 30 includes the aluminum film 32 which is of a high electrical conductivity and therefore, charges produced by contacts, collisions, etc. of the package 21 with another insulating body can be effectively discharged. Consequently, maloperation of the chip can be prevented.

Figure 4:
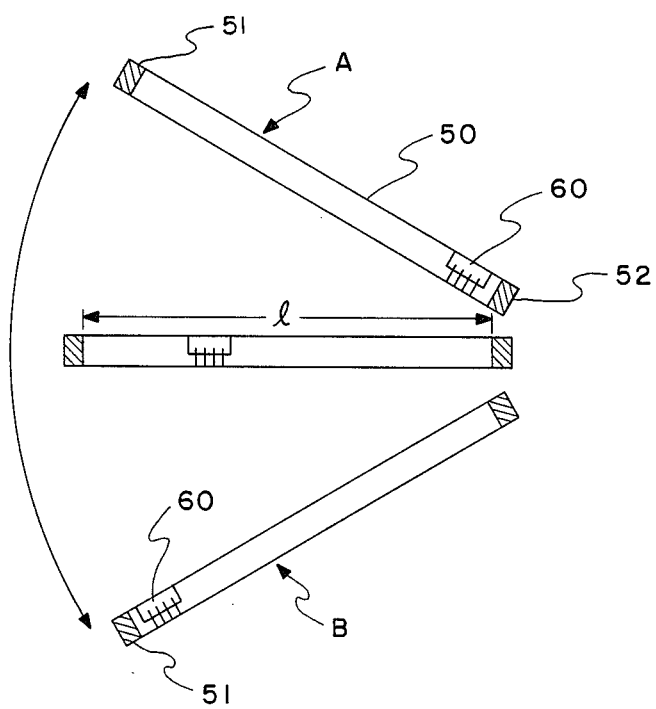
FIG. 4 is an outline view showing a test of a semiconductor memory device.

Referring to FIG. 4, one test piece of UV-EPROM 60 with the shading sheet 30 of the present invention attached thereon was inserted in a magazine case 50 which is made of vinyl chloride. Then, the magazine case 50 was repeatedly shaken from the state A to the state B state and vice versa to move the UV-EPROM 60 through a full distance l of 50 cm between stoppers 51 and 52. Shaking was done 20 times and the test piece 60 was taken out from the magazine case 50 to conduct electrical tests. Shaking followed by the electrical tests was conducted for fifty different test pieces, and any erroneous operation was not detected in all the fifty test pieces. On the other hand, when the similar tests were conducted for UV-EPROM's with the prior art shading papers attached thereon, erroneous operation was detected in four of fifty test pieces.

What is claimed is:

1. A semiconductor memory device comprising a semiconductor memory chip of such a type that information stored therein is erased by ultra-violet rays, a package housing said chip therein, a window plate hermetically fixed to said package, said window plate being transparent to ultra-violet rays, and a shading sheet adhering to said window plate, said shading sheet including a bond film, a metallic film on said bond film and a polyimide film on said metallic film.

2. A semiconductor memory device of claim 1, in which said metallic film is made of aluminum.

3. A semiconductor memory device of claim 1, in which the thickness of said bond film ranges from 10 $\mu$m to 100 $\mu$m, and the thickness of said metallic film ranges from 0.5 $\mu$m to 5 $\mu$m, the thickness of said polyimide film ranging from 30 $\mu$m to 100 $\mu$m.

4. A shading sheet for convering a window of a package of UV-EPROM, said shading sheet having a laminate structure including a bond film, a metallic film on said bond film, and a polyimide film on said metallic film, said bond film, metallic film and polyimide film having the same plane shape.

* * * * *